US006946391B2

(12) United States Patent
Tsai et al.

(10) Patent No.: US 6,946,391 B2
(45) Date of Patent: Sep. 20, 2005

(54) METHOD FOR FORMING DUAL DAMASCENES

(75) Inventors: Wei-Kung Tsai, Ping-Tung (TW); Po-Yueh Tsai, Tainan (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/658,707

(22) Filed: Sep. 8, 2003

(65) Prior Publication Data

US 2005/0054194 A1 Mar. 10, 2005

(51) Int. Cl.[7] .......................................... H01L 21/4763

(52) U.S. Cl. ...................... 438/638; 438/709; 438/740; 438/947; 438/976

(58) Field of Search ................................ 438/622, 638, 438/709, 725, 736, 738, 740, 947, 976

(56) References Cited

U.S. PATENT DOCUMENTS

| | | | | | |
|---|---|---|---|---|---|
| 6,323,121 | B1 * | 11/2001 | Liu et al. | .................... | 438/633 |
| 6,380,096 | B2 * | 4/2002 | Hung et al. | ................. | 438/723 |
| 6,589,881 | B2 * | 7/2003 | Huang et al. | ............... | 438/725 |
| 6,764,810 | B2 * | 7/2004 | Ma et al. | .................... | 430/313 |
| 2004/0121578 | A1 * | 6/2004 | Nam | .......................... | 438/622 |

FOREIGN PATENT DOCUMENTS

| | | | |
|---|---|---|---|
| KR | 2002-0083525 | * 12/2002 | ....... H01L/21/4763 |
| TW | 368732 | 9/1999 | |
| TW | 400620 | 8/2000 | |
| TW | 471125 | 8/2002 | |

* cited by examiner

*Primary Examiner*—Amir Zarabian
*Assistant Examiner*—Pamela E Perkins
(74) *Attorney, Agent, or Firm*—Tung & Associates

(57) ABSTRACT

A method for forming a dual damascene structure in a semiconductor device manufacturing process including providing a process wafer including a via opening extending through at least one dielectric insulating layer; blanket depositing a negative photoresist layer to include filling the via opening; blanket depositing a positive photoresist layer over and contacting the negative photoresist layer; photolithographically patterning the positive photoresist layer to form a trench opening etching pattern overlying and encompassing the via opening; etching back the negative photoresist layer to form a via plug having a predetermined thickness; and, etching a trench opening according to the trench opening etching pattern.

24 Claims, 2 Drawing Sheets

METHOD FOR FORMING DUAL DAMASCENES

FIELD OF THE INVENTION

This invention generally relates to integrated circuit manufacturing of multi-layered semiconductor devices and more particularly to a method for forming dual damascene structures with an improved patterning process.

BACKGROUND OF THE INVENTION

The escalating requirements for high density and performance associated with ultra large scale integration semiconductor wiring require increasingly sophisticated interconnection technology. As device sizes decrease it has been increasingly difficult to provide interconnection technology that satisfies the requirements of low resistance and capacitance interconnect properties, particularly where submicron inter-layer damascene interconnects (e.g., vias) and intra-layer interconnects having increasing aspect ratios (opening depth to diameter ratio) of greater than about 4.

In particular, in forming a dual damascene by a via-first method where the via opening is first formed in one or more dielectric insulating layers followed by forming an overlying and encompassing trench opening for forming a metal interconnect line, several processing steps are required which entail exposing the via opening to dry etching chemistries. As a result, the sidewalls of the via are subject to etching which causes variation in the via opening profile leading to undesirable variations in via electrical resistances and capacitances in the completed metal filled damascene.

Approaches to prevent exposing the via opening to etching process have included forming via filling materials within the via opening to protect the via opening from exposure to subsequent processes. For example, prior art processes typically include forming a via filling material within the via opening followed by etch back of the via filling material to form via plug prior to a photolithographic patterning process for forming the trench.

One problem with prior art processes for forming via plugs, are the several processing steps required to form the dual damascene structure. For example, during the etchback process, for example a plasma ashing process, to form the via plug, there is a tendency to form via plug filling particulate contamination remaining over the process wafer surface. Since the surface particulate contamination compromises the reliability of a subsequent trench patterning process, a separate wafer cleaning process is required prior to trench patterning. The separate processing steps of via plug filling layer deposition, etchback to form a via plug, and process wafer cleaning are time consuming.

Other related problems with prior art processes include the fact that exposed nitride layers following the etchback process may undesirably react with the overlying trench photoresist. For example, as feature sizes decrease to sub-quarter-micron dimensions photolithographic patterning processes require activating light (radiation) of increasingly smaller wavelength. For 0.25 micron and below CMOS technology, deep ultraviolet (DUV) positive photoresists have become necessary to achieve the desired resolution. Typically DUV photoresists are activated with activating light source wavelengths of less than about 250 nm, for example, commonly used wavelengths include 193 nm and 248 nm. Many DUV photoresists are chemically amplified using a photoacid generator activated by the light source to make an exposed photoresist area soluble in the development process.

One problem affecting DUV photoresist processes is the potential interference of residual nitrogen-containing species, for example amines, with the DUV photoresist. Residual nitrogen-containing contamination is one of the greater concerns in the use of metal nitride layers such as silicon oxynitride (e.g., SiON), which is commonly used as a bottom-anti-reflectance coating (BARC), also referred to as a dielectric anti-reflectance coating (DARC). Metal nitride layers, such as silicon oxynitride and silicon nitride are also frequently used as etching stop layers. The DARC layers and etching stop layers are typically exposed in the via plug etchback process leading to potential nitrogen containing species contamination of a subsequently deposited trench line DUV photoresist in a trench line patterning process. For example, it is believed that nitrogen containing species neutralize photogenerated acid catalysts which render portions of the photoresist insoluble in the developer. As a result, residual photoresist remains on patterned feature edges, sidewalls, or floors of features, detrimentally affecting subsequent anisotropic etching profiles.

There is therefore a need in the semiconductor processing art to develop an improved dual damascene manufacturing process to improve via protection while avoiding photoresist poisoning effects including a more efficient process to reduce a process cycle time thereby increasing wafer throughput.

It is therefore an object of the invention to provide an improved dual damascene manufacturing process to improve via protection while avoiding photoresist poisoning effects including providing a more efficient process to reduce a process cycle time thereby increasing wafer throughput, in addition to overcoming other shortcomings and deficiencies in the prior art.

SUMMARY OF THE INVENTION

To achieve the foregoing and other objects, and in accordance with the purposes of the present invention, as embodied and broadly described herein, the present invention provides a method for forming a dual damascene structure in a semiconductor device manufacturing process.

In a first embodiment, the method includes providing a process wafer including a via opening extending through at least one dielectric insulating layer; blanket depositing a negative photoresist layer to include filling the via opening; blanket depositing a positive photoresist layer over and contacting the negative photoresist layer; photolithographically patterning the positive photoresist layer to form a trench opening etching pattern overlying and encompassing the via opening; etching back the negative photoresist layer to form a via plug having a predetermined thickness partially filling the via opening; and, etching a trench opening according to the trench opening etching pattern.

These and other embodiments, aspects and features of the invention will become better understood from a detailed description of the preferred embodiments of the invention which are described in conjunction with the accompanying drawings.

DETAILED DESCRIPTION OF THE PREFERRED EMBODIMENTS

Although the method of the present invention is explained by exemplary reference the formation of a via-first method of formation of a dual damascene structure in a multi-level semiconductor device, it will be appreciated that the method of the present invention is equally applicable to forming a structure where one etched opening is formed overlying and at least partially encompassing one or more underlying etched openings. The method of the present invention is particularly advantageous in preventing damage to underlying vias and photoresist poisoning in the trench formation process, while reducing a number of processing steps.

While the method of the present invention is explained with exemplary reference to the formation of a copper filled dual damascene structure, it will be appreciated that the method is applicable where other metals, for example tungsten, aluminum, copper, or alloys thereof including the use of various types of adhesion/barrier liners. It will further be appreciated that the method may be applicable to dual damascenes with or without middle etch stop layers formed between dielectric insulating layers to separate a via portion and trench portion of the dual damascene. For example a single dielectric insulating layer may include both the via portion and the trench portion of the dual damascene structure.

Figure 1A:
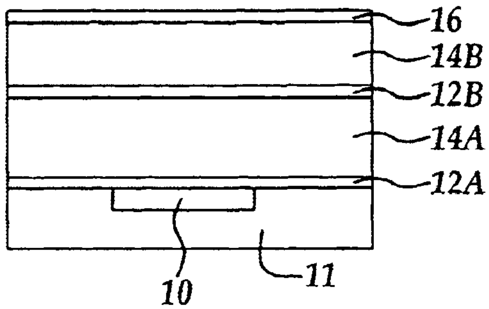
FIGS. 1A–1H are exemplary cross sectional views of a dual damascene structure at stages in manufacturing process according to an embodiment of the present invention.

For example, in an exemplary embodiment, referring to FIGS. 1A–1H, are shown schematic cross sectional views of a portion of a multi-level semiconductor device at stages in a dual damascene manufacturing process. Referring to FIG. 1A is shown a conductive region 10, for example, copper, formed in a dielectric insulating layer 11 having an overlying first etching stop layer 12A, for example, silicon nitride (e.g., SiN), silicon oxynitride, silicon carbide (SiC), or silicon oxycarbide (SiOC). First etching stop layer 12A is formed by a conventional chemical vapor deposition (CVD) process including low pressure CVD (LPCVD) or plasma enhanced CVD (PECVD) process at a thickness of about 300 Angstroms to about 700 Angstroms.

Still referring to FIG. 1A, formed over etching stop layer 12A is first dielectric insulating layer 14A, also referred to as an inter-metal dielectric (IMD) layer formed of preferably a low-K (low dielectric constant) material, for example, including fluorinated silicate glass (FSG), also referred to as fluorine doped silicon oxide, and carbon doped silicon oxide, also referred to as organo-silane glass (OSG). For example, preferably the low-K IMD layer has a dielectric constant of less than about 3.2, more preferably less than about 2.8. Typically, the IMD layer is formed having a thickness of about 3000 to about 7000 Angstroms.

Still referring to FIG. 1A, following deposition of the first IMD layer 14A, a second etching stop layer 12B is formed of a nitride or carbide as explained with respect to etching stop layer 12A, having a thickness of about 300 Angstroms to about 600 Angstroms. Formed over second etching stop layer 12B is a second IMD layer 14B, formed in the same manner and with the preferred materials outlined for IMD layer 14A. Typically, the second IMD layer is formed having a thickness about the same or slightly less than the first IMD layer, for example from about 2000 Angstroms to about 5000 Angstroms. It will be appreciated that a single IMD layer may be formed in place of the first IMD layer 12A, second etching stop layer 14B, and second IMD layer 12B.

Formed over the second IMD layer 14B is preferably formed a bottom anti-reflectance coating (BARC) layer 16, preferably an inorganic material that also functions as an etch stop layer. For example, silicon oxynitride and silicon oxycarbide are preferably used as a BARC/etch stop layer where the BARC layer also functions as an etch stop or hardmask layer to improve subsequent RIE etching profiles. It will be appreciated that a conventional etch stop layer such as silicon nitride and an overlying BARC layer such as silicon oxynitride may be used in place of a single BARC/etch stop layer 16. For example, the inorganic BARC layer 16 is formed at increments of $\lambda/4$ thickness according to the wavelength ($\lambda$) of a subsequent via patterning process to reduce light reflections by index matching. For example, the BARC layer is formed by conventional PECVD or LPCVD processes. Other metal nitrides such as titanium nitride (TiN) may be used as well, but are typically less preferred due to high surface reflectivity. However, an additional organic layer, such as an organic BARC layer or a cured negative resist layer, as outlined below, deposited over the inorganic BARC layer, effectively attenuates surface reflectivity thereby improving the functioning of the BARC layer 16.

Figure 1B:
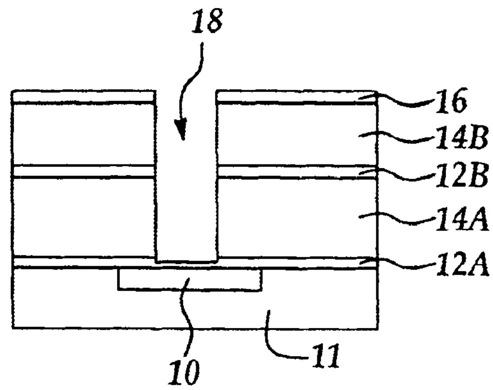

Referring to FIG. 1B, a via etching pattern is first formed according to a conventional photolithographic patterning process followed by a conventional plasma assisted etching process, for example a reactive ion etch (RIE) process, to form via opening 18. In the RIE etching process, the BARC layer 16 is first etched followed by sequentially etching through the second IMD layer 14B, the second etching stop layer 12B, the first IMD layer 14A, and preferably at least partially through first etching stop layer 12A.

Figure 1C:
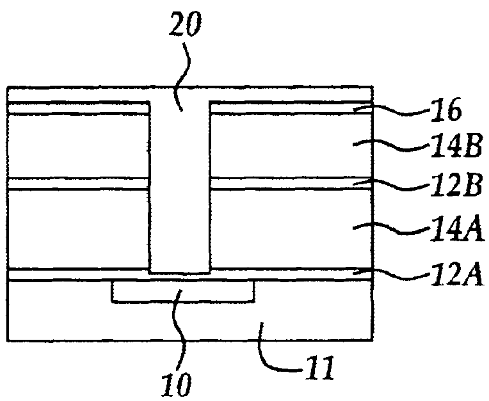

Referring to FIG. 1C, following etching of via opening 18, a flowable negative photoresist layer 20 is blanket deposited by a conventional coating process, for example a spin-coating process to fill via opening 18. The flowable negative photoresist layer is deposited to fill the via opening 18 and form a thin layer over the wafer surface, for example at a thickness of about 200 Angstroms to about 1000 Angstroms. The negative photoresist layer 20 is then subjected to at least a radiative curing process and optionally a subsequent thermal curing process to complete hardening of the negative photoresist and to drive off solvents. For example the negative photoresist is hardened by initiating polymeric cross-linking reactions upon exposure to an appropriate wavelength of light, e.g., UV or DUV wavelengths, for a period of time specific to the particular type of photoactive compound included in the negative photoresist. For example, during the photo-curing process polymeric cross-linking reactions occur to form a three-dimensional molecular network that is less soluble in a photoresist developer. A subsequent thermal curing process, for example heating the negative photoresist between about 100° C. and about 250° C. may be carried out to drive off solvents and complete the hardening process and to ensure complete evolution of nitrogen evolved during the curing process. For particular negative photoresists the negative photoresist is preferably cured in a nitrogen ambient, for example where the negative photoresist includes an azide containing photo-active compound, for example bis-arylazide. The negative photoresist is preferably rinsed with deionized water following the curing process.

Figure 1D:
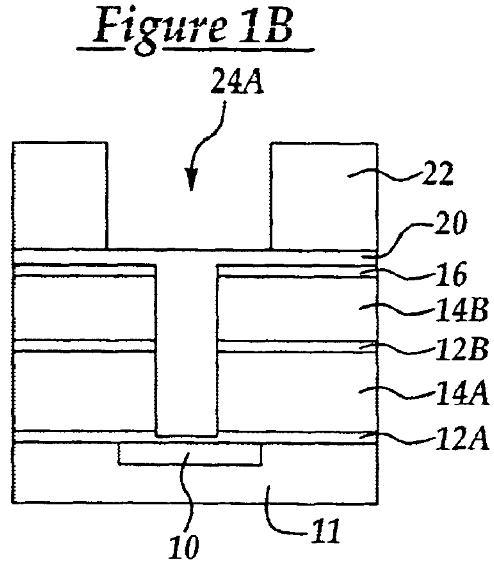

Referring to FIG. 1D, a positive photoresist layer 22 is then blanket deposited over the negative photoresist layer 20. A conventional positive resist photolithographic patterning process is then carried by conventional processes to pattern a trench opening 24A etching pattern overlying and encompassing via opening 18 to reveal the underlying negative photoresist layer which is preferably insoluble in the photoresist developer used to develop the positive photoresist, for example, tetramethyl-ammonium-hydroxide (TMAH). It will be appreciated that trench line openings e.g. 24A may encompass more than one via opening. An advantage of the present invention is that the negative photoresist layer 20 is unaffected by the positive photoresist layer 22 development process. Advantageously, the positive photoresist layer 22, for example DUV photoresist including photo acid generators, is unaffected by nitrogen contamination from the underlying BARC/etching stop layer, and is unaffected by a properly cured underlying negative photoresist layer 20.

Figure 1E:
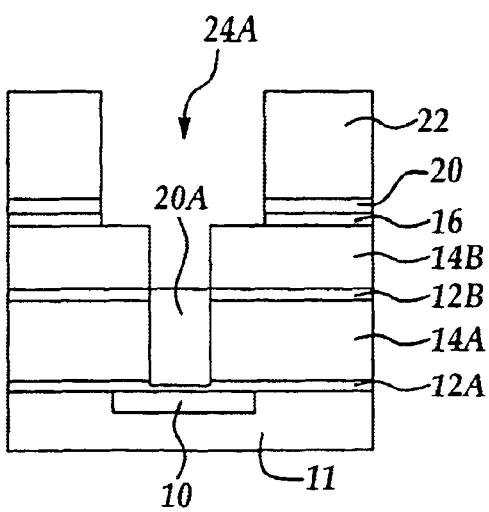

Referring to FIG. 1E, following the trench opening patterning process, the negative photoresist layer 20 is etched back to expose BARC/etching stop layer 16, followed by etching through the BARC/etching stop layer while etching back the via plug e.g., 20A at a predetermined thickness. For example, a conventional RIE etching process is carried out specific to the type of BARC/etching stop layer, for example a metal nitride etching chemistry including adjusting one of a nitrogen and oxygen concentration of the etchant chemistry to enhance negative photoresist layer 20 etching. According to an aspect of the present invention, preferably, the negative photoresist layer 20 is etched back in-situ with respect to a subsequent RIE etching process to etch the trench opening. Among the advantages of the method of the present invention is the avoidance of a separate wafer cleaning step to clean the process surface of particulate contaminants following the etchback process, necessary according to the prior art processes. In addition, since the etchback process etches simultaneously through both the BARC/etching stop layer 16 and the negative photoresist layer 20 to form the via plug e.g., 20A, a separate RIE etching step is eliminated.

Figure 1F:
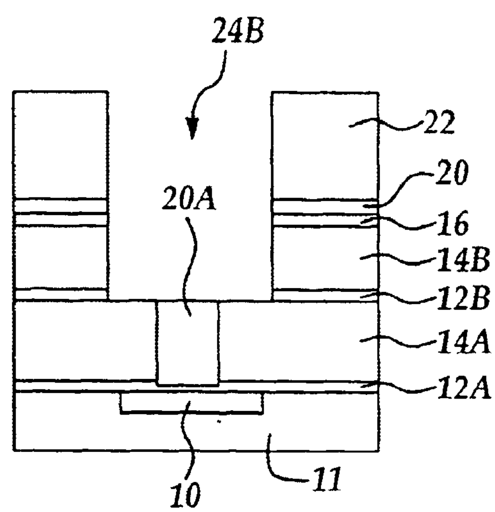

Referring to FIG. 1F, following etching back the negative photoresist layer 20 and etching through a thickness of the BARC/etching stop layer 16, a subsequent conventional RIE etching step is carried out in-situ with respect to the etchback process to etch through a thickness of the second IMD layer 14B and at least through a portion of the second etch stop layer 12B to form trench opening 24B.

Figure 1G:
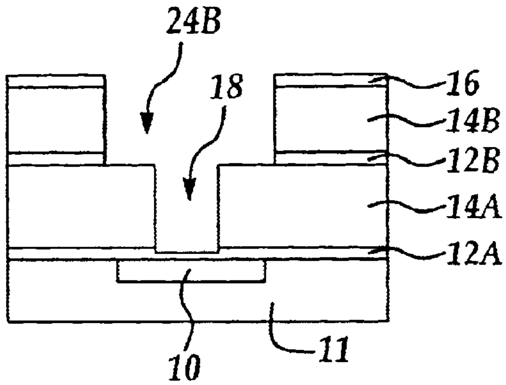

Referring to FIG. 1G, a conventional plasma ashing process is then carried out following an optional ex-situ after etch inspection process. The plasma ashing process preferably includes an oxygen containing etching chemistry to remove remaining portions of the positive photoresist layer 22 and a remaining portion of the negative photoresist e.g., layer 20 and via plug 20A) in a single plasma ashing process. Optionally, a conventional additional wet stripping process may be carried out following the plasma ashing process to ensure removal of residual organic material.

Figure 1H:
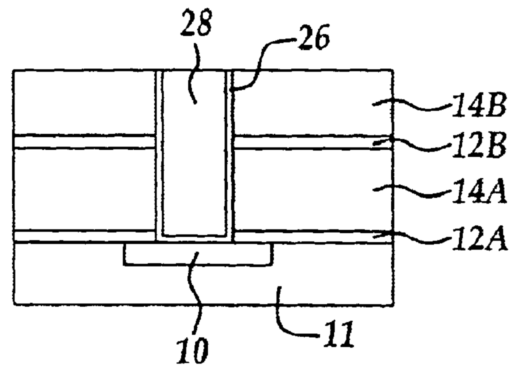

Referring to FIG. 1H, following the plasma ashing process, conventional processes are carried out including removing a remaining portion of first etching top layer 12A according to a conventional RIE process to reveal the underlying conductive area 10. The dual damascene structure is then completed by depositing an adhesion/barrier layer e.g., TaN layer 26 followed by filling the dual damascene with a copper layer e.g., 28 in an electro-chemical deposition (ECD) process. A CMP process is then carried out to remove excess copper and selected layers above the second IMD layer 12B to complete the formation of the dual damascene.

Figure 2:
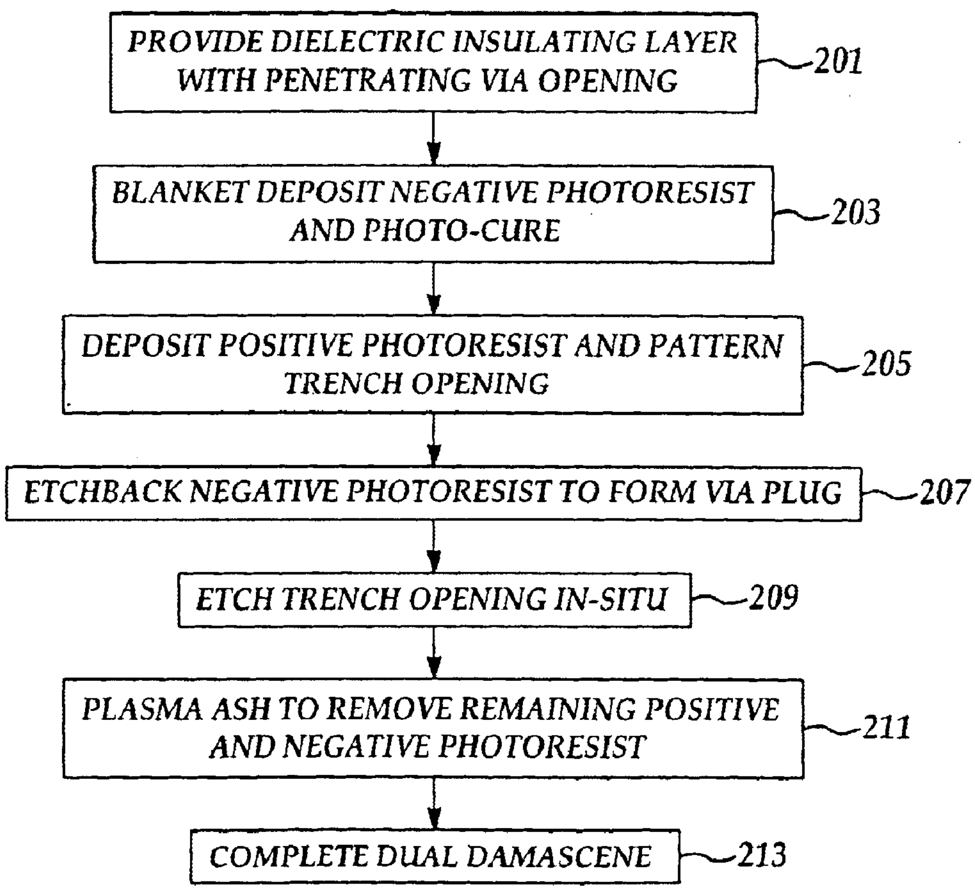
FIG. 2 is a process flow diagram including several embodiments of the present invention.

Referring to FIG. 2 is shown a process flow diagram including several embodiments of the present invention. In process 201, a semiconductor wafer comprising a via opening is provided extending through at least one dielectric insulating layer including an uppermost BARC/etching stop layer. In process 203, a negative photoresist layer is blanket deposited to include filling the via opening and cured by at least a photo-curing process. In process 205, a positive photoresist layer is blanket deposited over the negative photoresist layer and photolithographically patterned to form a trench opening pattern overlying and encompassing the via opening. In process 207, an RIE etching process is carried out to etch through the BARC/etching stop layer according to the trench opening pattern and etchback the negative photoresist layer to a predetermined thickness to form a via plug. In process 209, a second RIE etching process is carried out in-situ to etch the trench opening according to the trench opening pattern. In process 211, a plasma ashing process is carried out to remove remaining portions of the positive photoresist layer and the negative photoresist via plug. In process 213, subsequent conventional processes are carried out to complete a metal filled dual damascene.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for forming a dual damascene structure in a semiconductor device manufacturing process comprising the steps of:

providing a process wafer comprising a via opening extending through at least one dielectric insulating layer;

forming a first photoresist layer on the process wafer surface to include filling the via opening;

forming a second photoresist layer on the first photoresist layer;

photolithographicall patterning the second photoresist layer to form a trench opening etching pattern;

forming a via plug comprising the first photoresist layer wherein the first and second photoresist layers respectively comprise different types of photoresist selected from the group consisting of positive and negative photoresists; and, etching a trench opening according to the trench opening etching pattern.

2. The method of claim 1, further comprising carrying out a plasma ashing process to remove remaining portions of the first photoresist layer and the second photoresist layer following the step of etching a trench opening.

3. The method of claim 1, wherein the steps of forming a via plug and etching a trench opening are carried out in-situ according to a plasma assisted etching process.

4. The method of claim 1, wherein the at least one dielectric insulating layer comprises a lower dielectric insulating layer and an upper dielectric insulating layer separated by a middle etch stop layer.

5. The method of claim 1, wherein the via plug is formed to fill the via opening to a level at about where a bottom portion of the trench opening is formed.

6. The method of claim 1, wherein the at least one dielectric insulating layer is provided with an uppermost layer selected from the group consisting of a bottom anti-reflective coating (BARC) layer and an etch stop layer.

7. The method of claim 6, wherein the uppermost layer comprises an inorganic layer selected from the group consisting of silicon oxynitride, silicon oxycarbide, and titanium nitride.

8. The method of claim 6, wherein the uppermost layer is etched through to expose the at least one dielectric insulating layer during the step of forming a via plug.

9. The method of claim 1, further comprising the step of curing the first photoresist layer according to a curing process selected from the group consisting of photo-curing and thermal curing following the step forming a first photoresist layer.

10. The method of claim 9, wherein the first photoresist layer is cured in a nitrogen containing ambient.

11. The method of claim 1, wherein the at least one dielectric insulating layer comprises a low-K dielectric insulating layer selected from the group consisting of fluorine doped silicon oxide, carbon doped silicon oxide, and organo-silane glass.

12. The method of claim 1, further comprising the step of filling the via and trench openings with a conductive material.

13. The method of claim 1, wherein the first photoresist layer comprises a negative photoresist and the second photoresist layer comprises a positive photoresist.

14. The method of claim 1, wherein the first photoresist layer comprises a positive photoresist and the second photoresist layer comprises a negative photoresist.

15. The method of claim 1, wherein the step of forming a via plug comprises etching back the first photoresist layer.

16. The method of claim 1, wherein the via plug is formed to at least partially fill the via opening.

17. A method for forming a dual damascene structure in a semiconductor device manufacturing process comprising the steps of:

providing a process wafer comprising a via opening extending through at least one dielectric insulating layer and an uppermost bottom anti-reflective coating (BARC) layer;

forming a negative photoresist layer on the process wafer surface to include filling the via opening;

forming a positive photoresist layer on the negative photoresist layer;

photolithographically patterning the positive photoresist layer to form a trench opening etching pattern overlying and encompassing the via opening;

etching the negative photoresist layer to form a via plug having a predetermined thickness;

etching in-situ a trench opening according to the trench opening etching pattern; and, carrying out a plasma ashing process to remove remaining portions of the via plug and the positive photoresist layer.

18. The method of claim 17, wherein the at least one dielectric insulating layer comprises a lower dielectric insulating layer and an upper dielectric insulating layer separated by a middle etch stop layer.

19. The method of claim 17, wherein the predetermined thickness is at a level at about where a bottom portion of the trench opening is formed.

20. The method of claim 17, wherein the BARC layer comprises an inorganic layer selected from the group consisting of silicon oxynitride, silicon oxycarbide, and titanium nitride.

21. The method of claim 17, wherein the BARC layer is etched through to expose the at least one dielectric insulating layer during the step of etching the negative photoresist layer.

22. The method of claim 17, further comprising the step of curing the negative photoresist following the step of forming a negative photoresist layer.

23. The method of claim 17, wherein the at least one dielectric insulating layer comprises a low-K dielectric insulating layer selected from the group consisting of fluorine doped silicon oxide, carbon doped silicon oxide, and organo-silane glass.

24. The method of claim 17, further comprising the step of filling the via and trench openings with a conductive material.

* * * * *